(12) United States Patent
Liu et al.

(10) Patent No.: US 6,991,967 B2
(45) Date of Patent: Jan. 31, 2006

(54) APPARATUS AND METHOD FOR DIE ATTACHMENT

(75) Inventors: Deming Liu, Kwai Chung (HK); Ran Fu, Kwai Chung (HK); Kui Kam Lam, Kwai Chung (HK); Man Chung Raymond Ng, Kwai Chung (HK); Wai Yuen Cheung, Kwai Chung (HK)

(73) Assignee: ASM Assembly Automation Ltd., (HK)

( * ) Notice: Subject to any disclaimer, the term of this patent is extended or adjusted under 35 U.S.C. 154(b) by 59 days.

(21) Appl. No.: 10/785,293

(22) Filed: Feb. 23, 2004

(65) Prior Publication Data

US 2005/0186019 A1 Aug. 25, 2005

(51) Int. Cl.
*H01L 21/44* (2006.01)

(52) U.S. Cl. .................. 438/118; 438/119; 219/388; 228/42

(58) Field of Classification Search ........ 438/118–119; 219/388; 228/42
See application file for complete search history.

(56) References Cited

U.S. PATENT DOCUMENTS

| | | | |
|---|---|---|---|
| 4,359,620 A * | 11/1982 | Keller | 219/659 |
| 4,938,410 A * | 7/1990 | Kondo | 228/180.1 |
| 4,973,826 A * | 11/1990 | Baudry et al. | 219/466.1 |
| 4,983,804 A * | 1/1991 | Chan et al. | 219/616 |
| 5,409,543 A * | 4/1995 | Panitz et al. | 134/2 |
| 5,573,688 A * | 11/1996 | Chanasyk et al. | 219/388 |
| 6,135,344 A * | 10/2000 | Sakuyama et al. | 228/234.1 |
| 6,288,376 B1 * | 9/2001 | Tsumura | 219/635 |
| 6,386,422 B1 * | 5/2002 | Cheng et al. | 228/46 |
| 6,608,291 B1 * | 8/2003 | Collins et al. | 219/662 |

* cited by examiner

*Primary Examiner*—Luan Thai
(74) *Attorney, Agent, or Firm*—Ostrolenk, Faber, Gerb & Soffen, LLP

(57) ABSTRACT

The invention provides an apparatus for die attachment onto a substrate including non-metallic material, and metallic material that is adapted to receive a die having a eutectic coating. A heating conduit is provided through which the substrate is movable for heating the metallic material to a eutectic bonding temperature to facilitate bonding between the die and the metallic material at a die-attach position. An induction heating device at the die-attach position heats the metallic material of the substrate to the eutectic bonding temperature prior to attaching a die onto the metallic material.

16 Claims, 6 Drawing Sheets

APPARATUS AND METHOD FOR DIE ATTACHMENT

FIELD OF THE INVENTION

The invention relates to the bonding of semiconductor dice onto a carrier or substrate. The dice usually have back surfaces coated with a layer of solder for contacting and forming metallic bonds with the carrier or substrate, in a process commonly referred to as eutectic bonding of the dice.

BACKGROUND AND PRIOR ART

Conventionally, semiconductor devices in the form of semiconductor dice or integrated circuits are housed into packages. A package serves various important functions such as protecting the device from mechanical and chemical damage. It is also a bridge that interconnects the device with a next level of packaging. Die attachment is one of the steps involved in the packaging process during which the die is placed on and attached to a die pad formed on the carrier or substrate. There are various methods for attaching the device onto the die pad, such as by using epoxy and adhesive resin as an adhesive to stick the device onto the pad or stamping flux on the pad and placing a die with solder on its back surface onto the flux before performing a solder reflow process.

An increasingly popular approach is to directly mount a die with a back surface of the die coated with solder onto a heated substrate. The solder melts when it comes into contact with the heated substrate, and a bond is formed to the substrate. This method is conventionally termed as eutectic die bonding, since the solder on the die is usually made from a composition of eutectic alloy. Eutectic die bonding takes advantage of the lower melting point of eutectic alloys as compared to pure metals. The temperature of the substrate should be raised to above the melting point of the solder on the back surface of the die so that the solder melts immediately when the device is in contact with the die pad. When the substrate is subsequently cooled down, a metallurgical bond will form between the back surface of the die and the pad on the substrate. Some advantages of eutectic bonding over epoxy bonding include a higher service temperature capability for the die, good thermal/electrical conductivity between the die and the substrate and higher reliability.

When packaging devices like light-emitting diodes ("LED"), a non-metallic material such as a plastic housing may be present adjacent to the die pad for facilitating certain mounting functions. The plastic housing normally has a glass transition temperature of lower than 280° C., with a typical recommended process temperature of less than 260° C. With the global trend being to adopt lead-free solders in eutectic bonding, one dilemma emerges that constantly frustrates equipment manufacturers and packaging process engineers. Currently, the most popular lead-free solder comprises a Sn—Ag or Sn—Ag—Cu compound which has a melting temperature of around 220° C. As the process temperature should normally be 30 to 40° C. higher than the melting temperature of the solder, it is difficult in practice to find a process window that ensures effective die-bonding while preventing the plastic housing from overheating. An example of another type of packaging presenting such a problem is a composite substrate consisting of polymer and metal. The glass transition temperature for the polymeric part of the substrate is even lower, typically in the range of 180~230° C., and it is a problem to prevent the polymeric substrate from overheating when performing eutectic die-bonding.

A prior art heating system for eutectic die-bonding makes use of a heat tunnel system consisting of several heating zones. In each heating zone, there is a heating block embedded with several heating elements for heating a carrier or substrate. As the substrate is transported through the heat tunnel, heating is performed on the substrate and the temperature of a considerable portion of the substrate is made to rise to the temperature necessary for eutectic bonding to take place, even though only the die pad which receives the die should preferably be heated to the said bonding temperature. The other parts of the substrate are preferably not heated or should receive less heat. The problem is that due to a much lower thermal conductivity of plastic material, the temperature on the plastic housing or some part of the polymeric substrate could be even higher than that of the die pad. In such circumstances, the temperature of the plastic material may be higher than its glass transition temperature. As a result, the plastic housing or the polymeric substrate may be deformed or damaged.

SUMMARY OF THE INVENTION

It is an object of the invention to overcome some of the disadvantages of the prior art by obviating or reducing damage to non-metallic material present on a carrier or substrate when heating the same during eutectic die bonding. It is another object of the invention to regulate the temperature of the carrier or substrate during a die-attach process so as to reduce the risk of damage to the non-metallic material.

According to a first aspect of the invention, there is provided an apparatus for die attachment onto a substrate including non-metallic material, and metallic material that is adapted to receive a die having a eutectic coating, comprising: a heating conduit through which the substrate is movable for heating the metallic material to a eutectic bonding temperature to facilitate bonding between the die and the metallic material at a die-attach position; and an induction heating device at the die-attach position for heating the metallic material to the eutectic bonding temperature.

According to a second aspect of the invention, there is provided a method for attachment of a die having a eutectic coating to a substrate including non-metallic material, and metallic material adapted to receive the die, comprising the steps of: providing a heating conduit; heating the metallic material in the heating conduit to a eutectic bonding temperature to facilitate bonding between the die and the metallic material at a die-attach position while moving the substrate through the heating conduit; heating the metallic material by induction heating means to the eutectic bonding temperature at the die-attach position; and attaching a die to the metallic material at the die-attach position.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of the apparatus and method in accordance with the invention will now be described with reference to the accompanying drawings, in which.

DETAILED DESCRIPTION OF THE PREFERRED EMBODIMENT OF THE INVENTION

Figure 1:
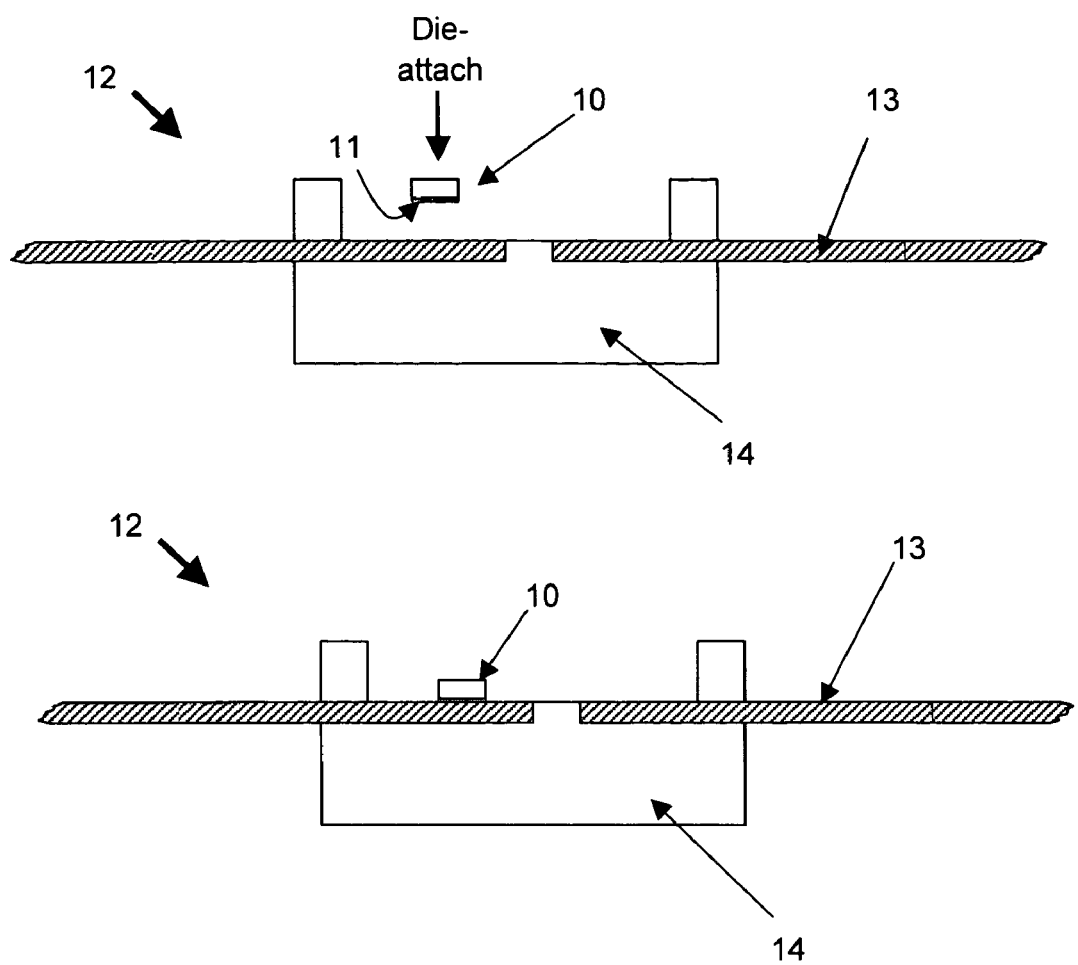
FIG. 1 is a side view representation of a die with solder on a back surface of the die being placed and attached onto a leadframe carrier with a plastic housing.

FIG. 1 is a side view representation of a die 10 with solder 11 on a back surface of the die being placed and attached onto a leadframe carrier 12 with a metallic portion 13 and a plastic housing 14. The die 10 is placed onto a surface of the metallic portion 13 of the leadframe carrier 12 inside an area bounded by the plastic housing 14. Such a leadframe carrier 12 with a plastic housing 14 is especially suitable for use in LED manufacture, the plastic housing being useful as a support for engagement with another component.

Figure 2:
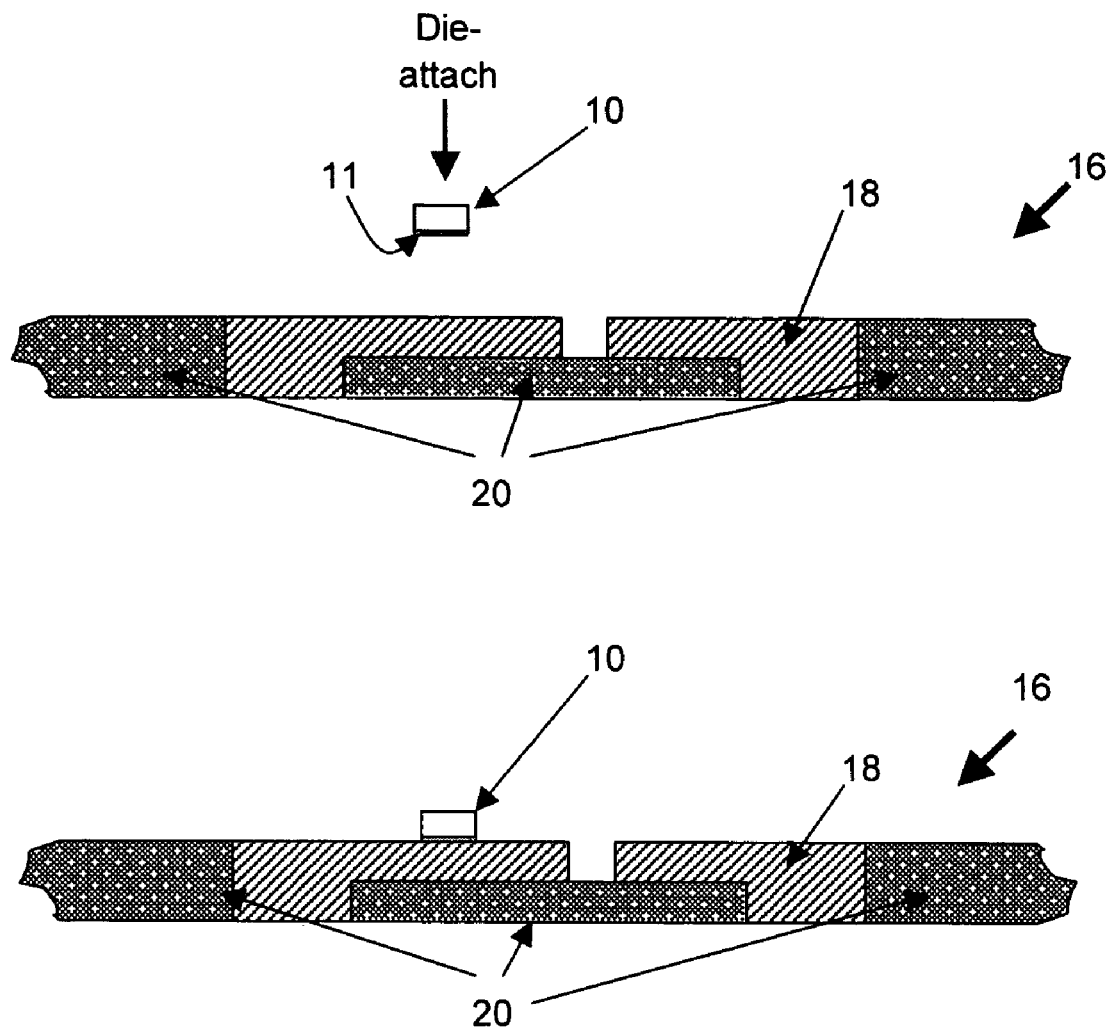
FIG. 2 is a side view representation of a die with solder on a back surface of the die being placed and attached onto a polymeric substrate.

FIG. 2 is a side view representation of a die 10 with solder 11 on a back surface of the die being placed and attached onto a polymeric substrate 16. The polymeric substrate 16 comprises primarily of a plastic strip 20, with a metal leadframe 18 mounted onto the plastic strip 20. The die 10 is placed onto the metal leadframe 18 portion of the polymeric substrate 16.

Figure 3:
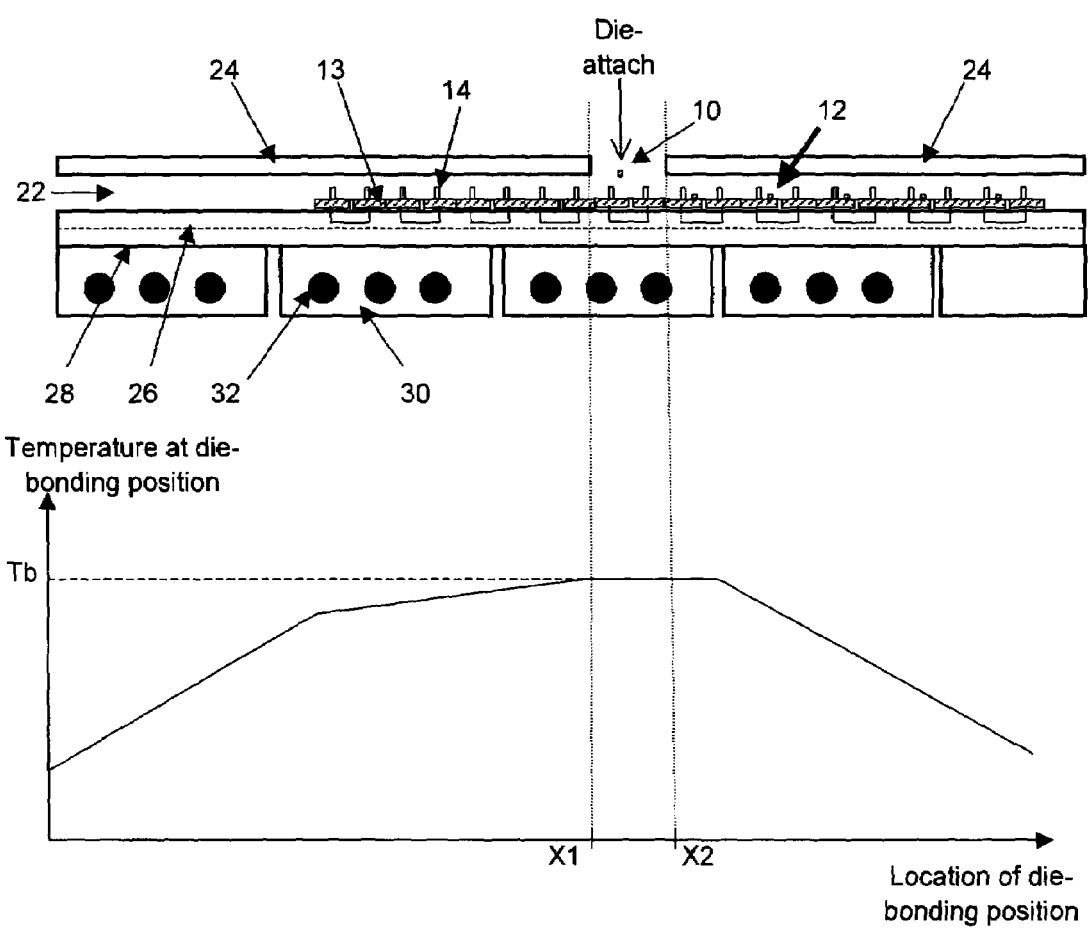
FIG. 3 is a side view representation of a heat tunnel of the prior art for facilitating attachment of a die onto a leadframe carrier with a plastic housing, and a heating profile obtained from an arrangement of heating blocks alongside the heat tunnel.

FIG. 3 is a side view representation of a heat tunnel 22 of the prior art for facilitating attachment of a die 10 onto a metallic portion 13 of a leadframe carrier 12 with a plastic housing 14. The heat tunnel 22 is covered by a top cover 24 and has a conveying surface for the leadframe carrier 12 comprising an upper hot plate 26 and a lower hot plate 28. The upper and lower hot plates 26, 28 form a stepped path in order to accommodate the plastic housing 14 protruding from the leadframe carrier 12. The upper and lower hot plates 26, 28 are heated by heating blocks 30 with embedded heating elements 32 located alongside the heat tunnel 22. There is a window in the top cover at a die-attach position where a die 10 with solder on a back surface of the die is placed onto the leadframe carrier 12.

The leadframe carrier 12 with plastic housing 14 is moved from left to right in FIG. 3. The leadframe carrier 12 needs to be heated to a certain temperature at the die-attach position for eutectic bonding to take place between the die 10 and the leadframe carrier 12. Each heating block 30 forms a heating zone that is adapted to heat the leadframe carrier 12 to a predetermined temperature. As the leadframe carrier 12 is moved through the heat tunnel 22 towards the die-attach position, it is heated in accordance with a heating profile in a gradual manner as it is moved past each heating block 30.

A heating profile obtained from an arrangement of heating blocks 30 alongside the heat tunnel 22 is also shown in FIG. 3. Tb represents a target bonding temperature at the die-attach position whereat eutectic bonding takes place. X1 and X2 represent start and end-points of the window in the top cover 24 at the die-attach position. As shown in FIG. 3, the leadframe carrier 12 is heated gradually as it passes through the heat tunnel 22. At the die-attach position between X1 and X2, the metallic portion 13 of the leadframe carrier 12 has been heated to temperature Tb that is suitable for eutectic bonding. After the position X2, the leadframe carrier 12 is allowed to gradually cool to ambient temperature.

The problem with such an arrangement is that the heating block 30 heats both the metallic portion 13 of the leadframe carrier 12 and plastic housing 14 for a prolonged period of time between the X1 and X2 positions and beyond. Due to lower thermal conductivity of plastic material and heat received from the heating block 30, the temperature of the plastic housing 14 rises past its glass temperature and may deform or be otherwise damaged by the heat. The quality of the finished product may thus be affected.

Figure 4:
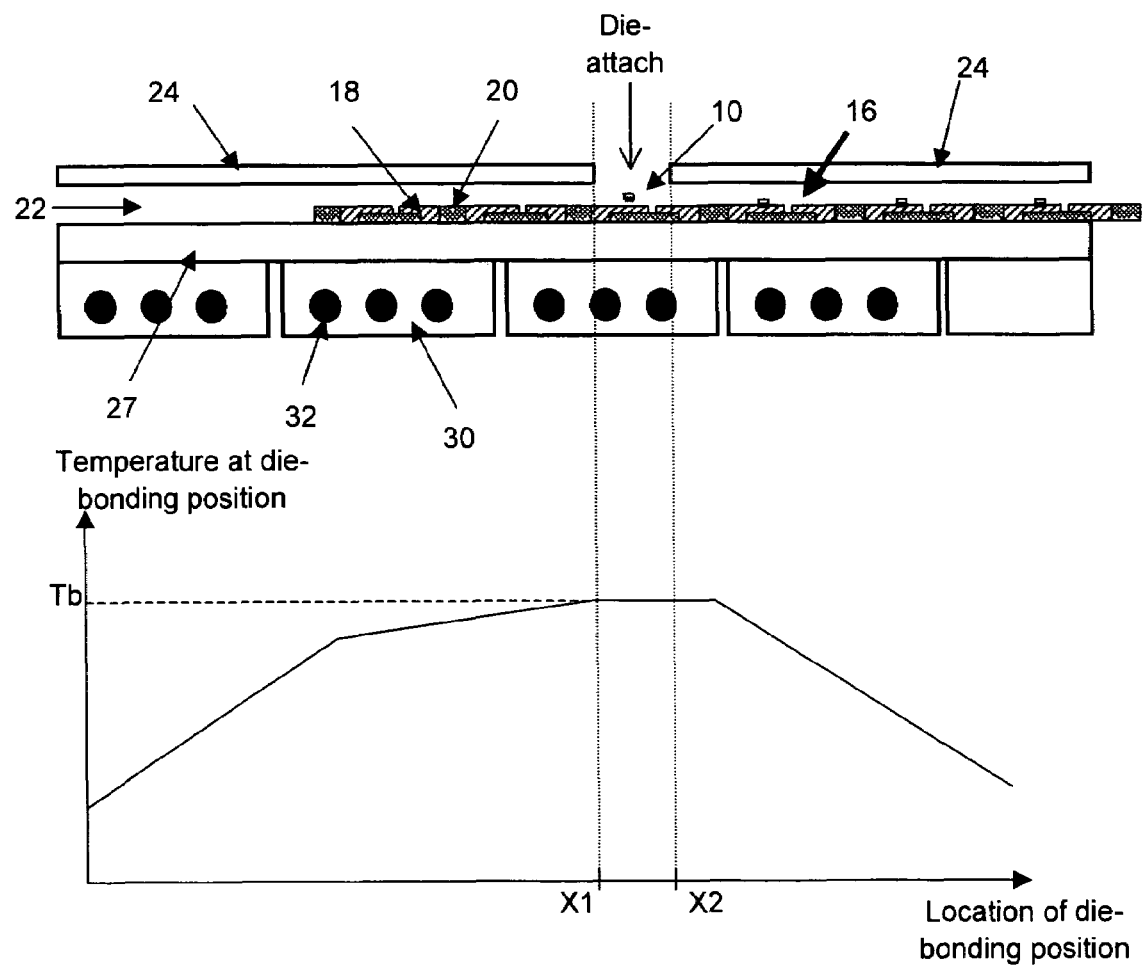
FIG. 4 is a side view representation of a heat tunnel of the prior art for facilitating attachment of a die onto a polymeric substrate, and a heating profile obtained from an arrangement of heating blocks alongside the heat tunnel.

FIG. 4 is a side view representation of a heat tunnel 22 of the prior art for facilitating attachment of a die 10 onto a polymeric substrate 16 which comprises a plastic strip 20, with a metal leadframe 18 mounted onto the plastic strip 20. The heat tunnel 22 is bounded by a top cover 24 at the top and a hot plate 27 at the bottom, on which the polymeric substrate 16 is conveyed. The top cover 24 has a window at a die-attach position for placing a die 10 with solder on a back surface of the die onto the metal leadframe 18 of the polymeric substrate 16.

As in FIG. 3, the polymeric substrate 16 is moved from left to right of the drawing, and is heated in accordance with a heating profile as it passes heating blocks 30 with embedded heating elements 32. A heating profile obtained from an arrangement of heating blocks 30 alongside the heat tunnel 22 is shown in FIG. 4. Between the X1 and X2 positions as defined by the width of the window of the top cover 24, the temperature of the metal leadframe 18 is at Tb and to enable eutectic bonding to take place.

However, it can be seen that the temperature of the metal leadframe 18 is maintained at Tb for a prolonged period of time, that is, between X1 and X2 and beyond. As a result, the plastic strip 20 of the polymeric substrate 16 which has a lower thermal conductivity may deform or be otherwise damaged by the heat absorbed by it.

Figure 5:
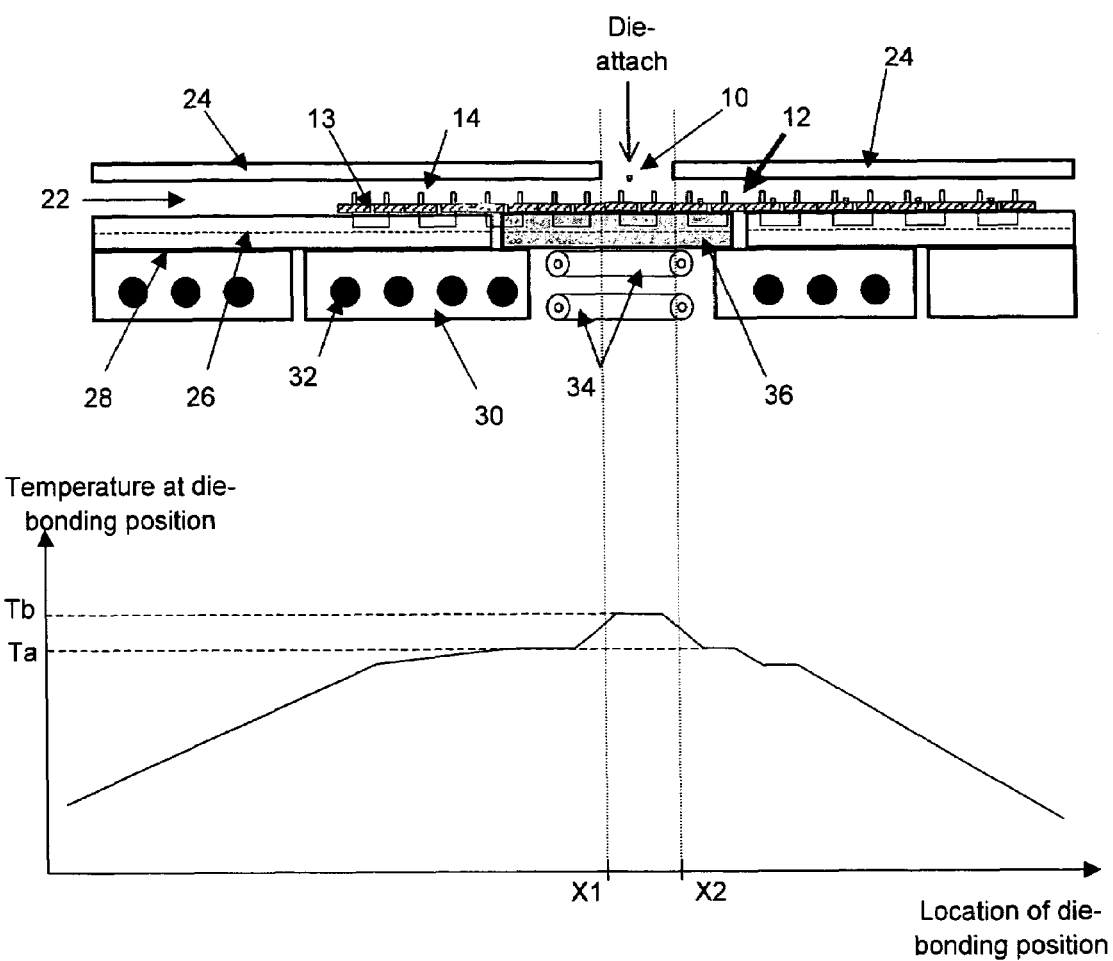
FIG. 5 is a side view representation of a heat tunnel for facilitating attachment of a die onto a leadframe carrier with a plastic housing, and a heating profile obtained from an arrangement of heating blocks and induction coil alongside the heat tunnel according to the preferred embodiment of the invention.

FIG. 5 is a side view representation of a heat tunnel 22 according to the preferred embodiment of the invention for facilitating attachment of a die 10 having a eutectic coating onto a substrate in the form of leadframe carrier 12 with a non-metallic material, such as a plastic housing 14, according to the preferred embodiment of the invention. The substrate includes the non-metallic plastic housing 14 and a metallic portion 13 for attaching the die 10. A heating conduit, such as heat tunnel 22, is bounded by a top cover 24 and conveying surface for the leadframe carrier 12 comprising an upper hot plate 26 and a lower hot plate 28. The substrate or leadframe carrier 12 is movable through the heat tunnel 22.

As in the prior art, the upper and lower hot plates 26, 28 form a stepped path in order to accommodate the plastic housing 14 protruding from the leadframe carrier 12. There is a window in the top cover at a die-attach position where a die 10 with solder on a back surface of the die is placed onto the metallic portion 13 of the leadframe carrier 12 for eutectic bonding. Thus, the metallic portion 13 of the leadframe carrier 12 needs to be heated to a eutectic bonding temperature to facilitate bonding between the die and the metallic material at the die-attach position.

The upper and lower hot plates 26, 28 are primarily heated by heating blocks 30 with embedded heating elements 32 located alongside the heat tunnel 22 as in the prior art. However, at the die-attach position, the leadframe carrier 12 is heated by an induction heating device such as an induction coil 34, instead of a heating block 30. The induction coil 34 is made of a metal coil with single or multiple windings. It is connected to an alternating power source with a variable power output and frequency for passing an alternating current through the coil. Preferably, the power output of the induction coil 34 is adjustable up to a magnitude of 10 kilowatts and the frequency is adjustable up to a magnitude of 10 megahertz. The induction coil 34 could be of a solenoid or pancake type, or be in any other form. Furthermore, in order to avoid the blocking of magnetic flux, the metallic hot plates 26, 28 at the die-attach region are replaced by a non-metallic support surface which may be made of ceramic material, such as a ceramic plate 36, to facilitate electromagnetic induction between the induction coil 34 and the metallic portion 13 of the leadframe carrier 12 for induction heating.

An advantage of using induction heating instead of a conventional heating block 30 with heating elements 32 is that heating can be concentrated at the metallic portion 13 of the leadframe carrier 12. The plastic housing 14 does not interact with the induction coil 34 and therefore is not heated directly. Instead, it receives heat indirectly from the metallic portion 13, such that its low thermal conductivity becomes less of an issue. Risk of damage to the non-metallic housing can therefore be obviated or reduced without direct heating of it.

A heating profile obtained from an arrangement of the heating blocks 30 and induction coil 34 according to the preferred embodiment of the invention is also shown in FIG. 5. Through the arrangement of the heating blocks 30 and induction coil 34 alongside the heat tunnel 22, the leadframe carrier 12 is gradually heated by the heating blocks 30 in accordance with a heating profile prior to reaching the die-attach position. The temperature of a die-bonding position of the leadframe carrier 12 at that point is preferably at Ta, which is below a known glass transition temperature or glass point of the material of the plastic housing 14. The temperature of the die-bonding position of the leadframe carrier 12 should preferably be maintained at below the glass point prior to induction heating at the die-attach position.

At the die attach position between X1 and X2 as defined by the window in the top cover 24, the rate of heating of the die-bonding position of the leadframe carrier 12 from Tb to Ta is substantially increased as compared to the prior art and as compared to the rate of heating from an ambient temperature to just below the glass point. The rate of cooling from Tb to Ta is also substantially increased as compared to the prior art to reduce exposure of the plastic housing 14 to the higher temperature and as compared to the rate of cooling from below the glass point to an ambient temperature. The aim here is to maintain the metallic portion 13 of the substrate or leadframe carrier 12 at the eutectic bonding temperature for a sufficient period of time for bonding the die to the metallic portion, but before the non-metallic material is heated to above its glass point.

The result is that the metallic portion 13 of the leadframe carrier 12 is maintained at the eutectic bonding temperature Tb for a shorter period of time. By reducing the period of time that the metallic portion 13 is at temperature Tb, the risk of damage to the plastic housing 14 through heat transmitted from the metallic portion 13 of the leadframe carrier 12 to the plastic housing 14 is further reduced.

Figure 6:
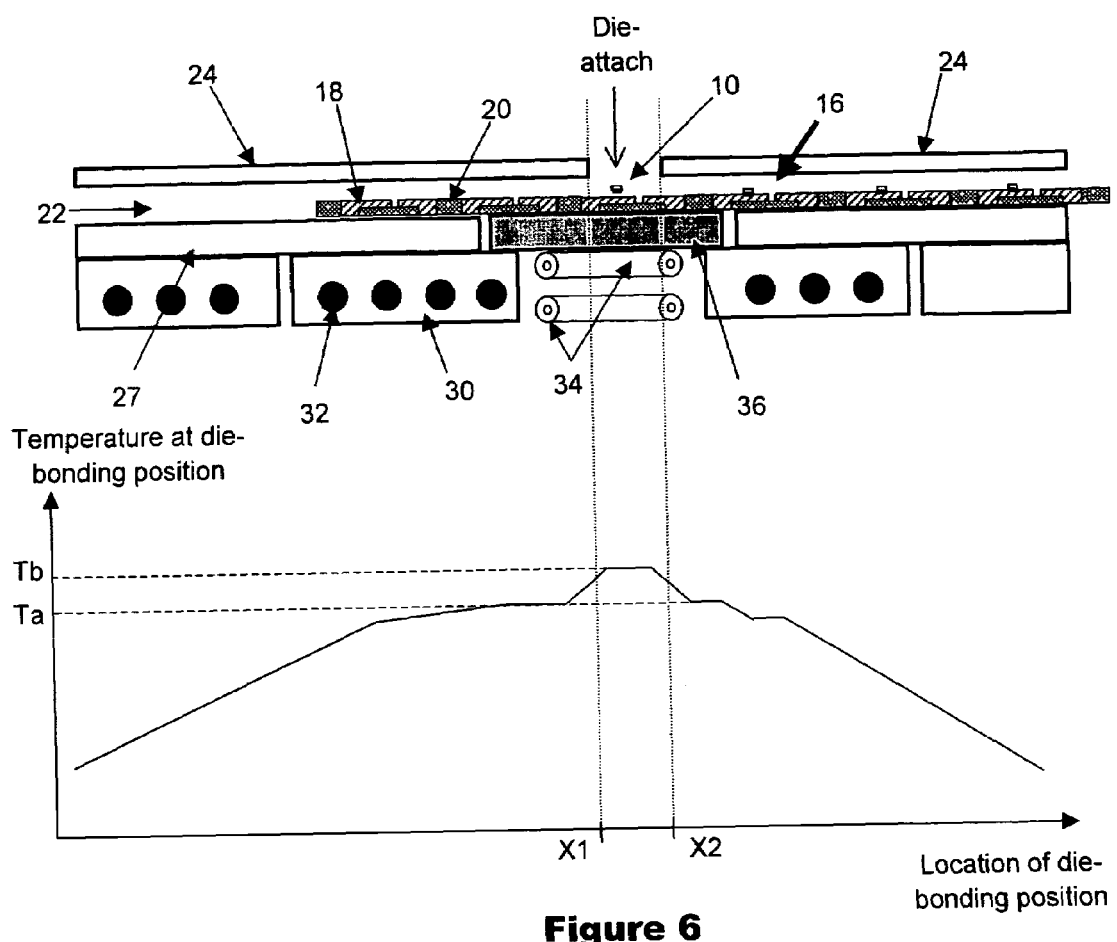
FIG. 6 is a side view representation of a heat tunnel for facilitating attachment of a die onto a polymeric substrate, and a heating profile obtained from an arrangement of heating blocks and induction coil alongside the heat tunnel according to the preferred embodiment of the invention.

FIG. 6 is a side view representation of a heat tunnel 22 for facilitating attachment of a die 10 onto a polymeric substrate 16 including non-metallic material according to the preferred embodiment of the invention. The main difference from the heat tunnel of FIG. 5 is that there is a single layer of hot plate 27 instead of upper and lower hot plates 26, 28, due mainly to the structure of the polymeric substrate 16. The other parts of the heat tunnel 22 are the same as FIG. 5 and will not be further described.

The polymeric substrate 16 is moved from left to right through the heat tunnel 22 and is heated by the heating blocks 30 located alongside the heat tunnel 22. At the die-attach position, the heating block 30 is replaced by an induction coil 34 and the polymeric substrate 16 is supported by a ceramic plate 36. Thus, the metallic material of the metal leadframe 18 to which the die 10 is attached is heated by the induction coil 34 using induction heating at the die-attach position.

A heating profile obtained from an arrangement of the heating blocks 30 and induction coil 34 according to the preferred embodiment of the invention is also shown in FIG. 6. The heating blocks 30 heat the die-bonding position on the metal leadframe 18 to a temperature Ta which is below the glass point of the non-metallic plastic strip 20 of the polymeric substrate 16. Thereafter, the induction coil 34 heats the die-bonding position of the metal leadframe 18 to a eutectic bonding temperature Tb at a substantially faster rate as compared to the prior art, before maintaining the metal leadframe 18 at temperature Tb for a shorter period of time. After die-attach has taken place, the metal leadframe 18 is cooled to temperature Ta, again at a substantially faster rate as compared to the prior art. From then on, the metal leadframe 18 may be allowed to cool at a gradual rate as with the prior art process.

It should be appreciated that although the above description relates to the use of means other than induction heating outside the die-attach position in the form of conventional heating blocks, induction heating devices can also be provided outside the die-attach position so as to suitably adjust the temperature profile of the substrate as it moves through the heating conduit. The use of induction heating at the die-attach position avoids direct transmission of heat to the non-metallic material found on the carrier or substrate, to slow down the rate at which the non-metallic material reaches its glass or melting temperature. Instead, heat is transmitted indirectly from the metal leadframe 18 to the plastic strip 20. Furthermore, the eutectic bonding temperature Tb is maintained for a shorter period of time which is just sufficient for placing of the die and eutectic bonding to take place between the die and the metallic surface to which it is bonded. Due to the above factors, risk of damage to non-metallic material is obviated or reduced, and the quality of the finished product may thus be improved.

The invention described herein is susceptible to variations, modifications and/or additions other than those specifically described and it is to be understood that the invention includes all such variations, modifications and/or additions which fall within the spirit and scope of the above description.

What is claimed is:

1. An apparatus for die attachment onto a substrate including non-metallic material, and metallic material that is adapted to receive a die having a eutectic coating, comprising:
    a heating conduit through which the substrate is movable that is configured to heat the metallic material while maintaining a temperature of the metallic material below a glass transition temperature of the non-metallic material prior to bonding the die to the metallic material at a die attach position; and
    an induction heating device at the die-attach position for heating the metallic material to a eutectic bonding temperature to facilitate bonding between the die and the metallic material.

2. An apparatus according to claim 1, including a non-metallic support surface for the substrate at the die-attach position.

3. An apparatus according to claim 2, wherein the non-metallic support surface is made of ceramic material.

4. An apparatus according to claim 1, wherein the induction heating device comprises an induction coil comprised of a metal coil with single or multiple windings.

5. An apparatus according to claim 1, wherein the power output of the induction heating device is 10 kilowatts or less.

6. An apparatus according to claim 1, wherein the induction heating device is operated at a frequency of 10 megahertz or less.

7. An apparatus according to claim 1, including one or more induction heating devices located outside the die-attach position where induction heating takes place.

8. A method for attachment of a die having a eutectic coating to a substrate including non-metallic material, and metallic material adapted to receive the die, comprising the steps of:
    providing a heating conduit;
    heating the metallic material in the heating conduit while maintaining a temperature of the metallic material below a glass transition temperature of the non-metallic material prior to bonding the die to the metallic material at a die-attach position while moving the substrate through the heating conduit;
    heating the matallic material by induction heating means to the eutectic bonding temperature at the die-attach position; and
    attaching a die to the metallic material at the die-attach position.

9. A method according to claim 8, including the step of maintaining the metallic material at the eutectic bonding temperature for a sufficient period of time for bonding the die to the metallic material, but before the non-metallic material is heated to above its glass transition temperature.

10. A method according to claim 8, wherein the rate of heating the metallic material from below the glass transition temperature to the eutectic bonding temperature is substantially higher than the rate of heating it from an ambient temperature to below the glass transition temperature.

11. A method according to claim 8, including the step of cooling the metallic material to a temperature that is below the glass transition temperature of the non-metallic material after attachment of the die at the die-attach position.

12. A method according to claim 11, wherein the rate of cooling the metallic material from the eutectic bonding temperature to below the glass transition temperature is substantially higher than the rate of cooling the metallic material from the glass transition temperature to an ambient temperature.

13. A method according to claim 8, wherein the induction heating means comprises an induction coil comprised of a metal coil with single or multiple windings.

14. A method according to claim 8, including supporting the substrate with a non-metallic support at the die-attach position.

15. A method according to claim 14, wherein the non-metallic support is made of ceramic material.

16. A method according to claim 8, including heating of the metallic material by induction heating means outside the die-attach position where induction heating takes place.

* * * * *